United States Patent
Prabhu et al.

(10) Patent No.: US 6,607,941 B2
(45) Date of Patent: Aug. 19, 2003

(54) PROCESS AND STRUCTURE IMPROVEMENTS TO SHELLCASE STYLE PACKAGING TECHNOLOGY

(75) Inventors: Ashok Prabhu, San Jose, CA (US); Nikhil Kelkar, Santa Clara, CA (US); Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/044,805

(22) Filed: Jan. 11, 2002

(65) Prior Publication Data

US 2003/0134453 A1 Jul. 17, 2003

(51) Int. Cl.[7] .......... H01L 21/44; H01L 21/30; H01L 23/544; H01L 29/40
(52) U.S. Cl. .......... 438/113; 438/458; 257/620; 257/621
(58) Field of Search .......... 438/113, 458; 257/620, 621

(56) References Cited

U.S. PATENT DOCUMENTS 6,429,036 B1 * 8/2002 Nixon et al. .......... 438/57

* cited by examiner

Primary Examiner—Steven Loke
Assistant Examiner—Samuel A Gebremariam
(74) Attorney, Agent, or Firm—Beyer Weaver & Thomas, LLP

(57) ABSTRACT

A variety of improved shell case style packages as well as shell case style wafer level packaging processes are described. Generally, in shell case style packaging, traces are patterned on the top surface of a wafer. In some embodiments, the conductors formed along the sides of the package are formed from at least a couple conductor layers to improve the adhesion of the conductors to the traces formed on the top surface of the devices. In some embodiments the conductors are patterned during processing such that the conductors are not cut during the wafer dicing operation. This arrangement is particularly useful when the conductors are formed at least partially from aluminum (or other metals that oxidize in ambient air). In other embodiments, BCB is not used under the trace layer in regions that will have notches formed therein so that the resulting package does not have any exposed BCB/trace junctions. In some embodiments, no BCB layer whatsoever is applied during packaging. In other embodiments, BCB is used, but the BCB layer is patterned to avoid dice line areas that will later be trenched or notched.

17 Claims, 5 Drawing Sheets

PROCESS AND STRUCTURE IMPROVEMENTS TO SHELLCASE STYLE PACKAGING TECHNOLOGY

FIELD OF THE INVENTION

The present invention relates generally to integrated circuit (IC) packages. More particularly, the invention relates to improvements in wafer level IC packaging.

BACKGROUND OF THE INVENTION

The packaging of ICs is an important aspect of manufacturing IC devices. Significant issues in manufacturing IC packages are often cost and device reliability. Costs in IC packaging include bill-of-materials and cost of assembly. In addition, the percentage of devices that pass minimum requirements, or production yield, is an important cost containment measure. Efforts have continually been made to reduce packaging cost. One relatively recently developed package is the chip-scale "ShellOP" type packaging technology developed by Shellcase Ltd. of Israel. A cross-sectional view of a typical ShellOP package is shown by way of example in FIG. 1.

The ShellOP package is a wafer level packaging technology where substantially all of the packaging process occurs on the IC wafer directly, instead of being a separate process after the wafer is diced. Wafer level packaging enables making chip-scale IC packages with very accurate mechanical alignment and materials processing. IC package 100 is an optically active device based on the ShellOP packaging design. The packaging process employs standard wafer processing techniques such as grinding, photolithography, etching, metal deposition, plating, and dicing. Unlike many packaging methods, the Shellcase process requires no lead frames, or wire bonding. The optical package comprises semiconductor bulk 102, which is held in placed in between a top glass plate 104 and a lower glass plate 106 by epoxy 116 and 118, respectively. Inverted external leads 107 are electrically connected to die terminals 206 by trace contacts 110 at junctions 112. Junction 112 is sometimes referred to as a T-junction, and contact 110 as a T-junction contact. External leads 107 are coated with a protective solder-mask 111. Solder-mask 111 is a dielectric material that electrically isolates leads 107 from external contact, and protects the lead surface against corrosion. Contacts 114 are attached to the bottom end of leads 107, and are suitable for printed circuit board (PCB) mounting by known methods. Contacts 114 may be formed by known methods such as solder-balls or plating, and may be suitably shaped for PCB mounted.

To better appreciate the important steps in forming IC package 100, the wafer level packaging process will herein be briefly described. Usually, a semiconductor wafer has a large number of isolated device areas that are later individually packaged for use. FIG. 2a illustrates a diagrammatic cross-sectional view of the initial stage of the ShellOP wafer level packaging process for three representative device areas. The ShellOP packaging process starts with processed wafer 202. Wafer 202 has a multiplicity of device areas that are each defined between dice saw lines 204. Saw lines 204, also referred to as the "saw street", define where the wafer will be cut, or diced, into singulated devices. Each device area has passivation layer 208 and a multiplicity of metal die terminals 206 formed on the wafer and appropriately connected to circuitry in the die. Usually, passivation layer 208 is applied over the active surface area of the wafer, leaving contacts 206 exposed. Passivation layer 208 prevents materials subsequently deposited over the wafer surface from contaminating circuits in the die. A benzocyclobutene (BCB) layer 210 is deposited onto passivation layer 208. An aluminum interconnect layer 212 is patterned over BCB layer 210, wherein the patterned traces electrically couple die terminals 206 to later formed leads for external device connection. The top protective structure is formed, as illustrated in FIG. 2b, by attaching glass cover 104 onto the wafer's topside via optical clear epoxy 116. The structural rigidity provided by glass cover 104 permits wafer 202 to be thinned by material removal process 214, which uniformly removes bottom-side wafer material until a predetermined wafer thickness is achieved.

As shown in FIG. 2c, the wafer is then etched from the bottom along saw-streets 204 by etching process 216, isolating semiconductor bulk device regions 102. For example, etching process 216 can be a selective silicon etching method. Passivation layer 208 is an etch-stop to etching process 216, whereby a multiplicity of trench-like structures aligned with saw-streets 204 are created. As illustrated in FIG. 2d, lower glass cover 106 is adhesively attached to the wafer's bottom surface via epoxy resin 118, forming the IC package's lower protective structure. Epoxy resin 118 fills all the etched trenches previously created.

To begin the process of lead formation, wafer assembly 200 is notched from the bottom side along saw-streets 204, the notch extending through trace layer 212 and up to top glass cover 104, whereby the lower surface of the top glass cover 104 is cut into. The resulting structure is shown in FIG. 2e. Importantly, the notches cut into the wafer assembly cut through traces in trace layer 212 that extended over the saw-street, thereby exposing a cross-sectional surface of T-junction contacts 110 at T-junction 112. T-junction contacts 110 are simply traces that are cut in the saw-street that will be connected at T-junction 112 to later formed leads. It should be noted that the exposed surfaces of T-junction contacts 110 are prone to corrosion during the manufacturing process and must be cleaned before subsequently depositing external leads. The cleaning procedure (not shown) is referred to as an anti corrosion treatment (ACT). Leads 107 are formed, as shown in FIG. 2f, by depositing aluminum onto the exposed surface of the notches previously cut into bottom-side saw-streets, thereby making physical, non-metallurgical, contact between leads 107 and the exposed ACT cleaned surface of T-junction contact 110 at T-junction 112. Leads 107 are further deposited below bottom glass cover 106, terminating at locations where PCB contacts will be formed thereon.

FIG. 2g illustrates a cross-section of the pre-singulated wafer assembly, where to avoid short-circuits from occurring, dielectric 319 is applied onto the exposed surface of leads 107, leaving uncovered bottom-side areas where contacts 114 are attached for PCB mounting. The multiplicity of device areas are thereafter singulated into individual IC packages by cutting through saw-streets 204, thereby making the completed IC package 100 illustrated in FIG. 1.

Although the foregoing wafer-level packaging process generally works well, there are continuing efforts to improve the package reliability and yield. It would also be desirable if these process improvements are also applicable to some other package designs.

SUMMARY OF THE INVENTION

To achieve the foregoing and other objects of the invention, a few improvements that are generally applicable to ShellOP style wafer level packaging processes are described. Generally, in Shellcase style packaging, traces are patterned on the top surface of a wafer. A top substrate is thereafter adhered directly or indirectly to a top surface of the wafer over the trace layer. Trenches are formed between the dice from a backside of the wafer and a bottom substrate is adhered directly or indirectly to a bottom surface of the trenched wafer. The backside of the resulting sandwiched wafer structure is then notched along the dice lines such that the notches cut through the bottom substrate and the traces thereby exposing portions of the traces. Conductors are then formed that extend into the notched surface of the sandwiched wafer structure. The conductors are arranged to contact, but not metallurgically bond with associated traces.

In one aspect of the invention, the conductors are formed from first and second conductor layers. In some embodiments, one of the conductors layers and the traces are both formed from aluminum and the second conductor layer is formed from a material that improves the adhesion of the conductors to the traces. By way of example, titanium and titanium based alloys such as titanium nitride (TiN) work well as the first conductor layer.

In another aspect of the invention, the conductors are plated with a conductive material that does not readily significantly oxidize when exposed to ambient air. The conductors are also patterned such that the conductors are not exposed during the dicing operation. This arrangement is particularly useful when the conductors are formed at least partially from aluminum (or other metals that oxidize in ambient air). In yet another aspect of the invention, BCB is not used under the trace layer in regions near the T-junction so that the resulting package does not have any exposed BCB/trace junctions. In some embodiments, no BCB layer whatsoever is applied during packaging. In other embodiments, prior to the formation of the trace layer, a BCB layer is formed over a top surface of the wafer. However, the BCB layer is patterned to avoid dice line areas that will later be trenched or notched In other aspects of the invention, improved integrated circuit package structures are described. In various aspects, a shell case type package is provided having a die that is sandwiched by a pair of substrates. Conductive traces are formed over the top surface of the die and conductors are formed along the sides of the die. Typically, the conductors extend along the bottom surface of the lower substrate. The conductors contact but are not metallurgically bonded to their respective associated traces.

In another package aspect of the invention, the conductors are formed from multiple layers in order to improve the adhesion of the conductors to the traces. By way of example, in embodiments where the traces and the second conductive layer are formed from aluminum, the first conductive layer may be formed from a variety of materials including titanium and titanium based alloys. In various embodiments, the substrate layers are formed from glass. An adhesive material such as epoxy is used to adhere the glass layers to the die. With this arrangement, the portions of the conductors that extend along the sides of the die directly contact the adhesive and not the sides of the die itself.

In other aspects of the invention, improved intermediate structures are provided which are useful in wafer based packaging of integrated circuits.

BRIEF DESCRIPTION OF THE DRAWINGS

The present invention is illustrated by way of example, and not by way of limitation, in the figures of the accompanying drawings and in which like reference numerals refer to similar elements and in which.

It is also to be understood that the depictions in the Figures are not necessarily drawn to scale.

DETAILED DESCRIPTION OF THE EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

As known Shellcase and ShellOP style, wafer level packaging processes result in T-junction connection reliability and yield problems. Issues such as BCB layer thermal expansion, over-etching during the anti-corrosion treatment (ACT), and lead delamination due to humidity have been observed to appreciably increase the rate of T-junction separation failures.

Figure 1:
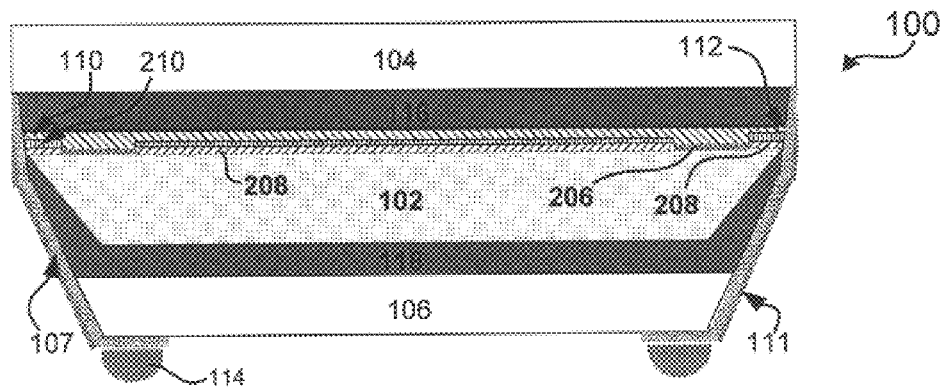
FIG. 1 illustrates a diagrammatic cross-sectional view of a known chip-scale Shellcase packaging technology.
Figure 2A:
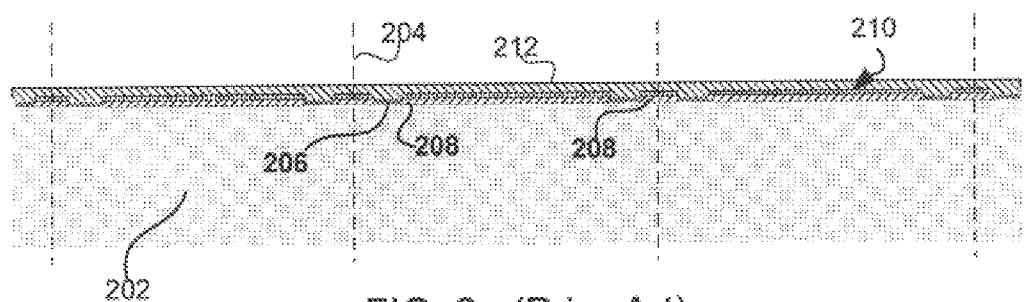
FIG. 2a illustrates a diagrammatic cross-sectional view of the initial stage of the known wafer level packaging process for three representative device areas.
Figure 2B:
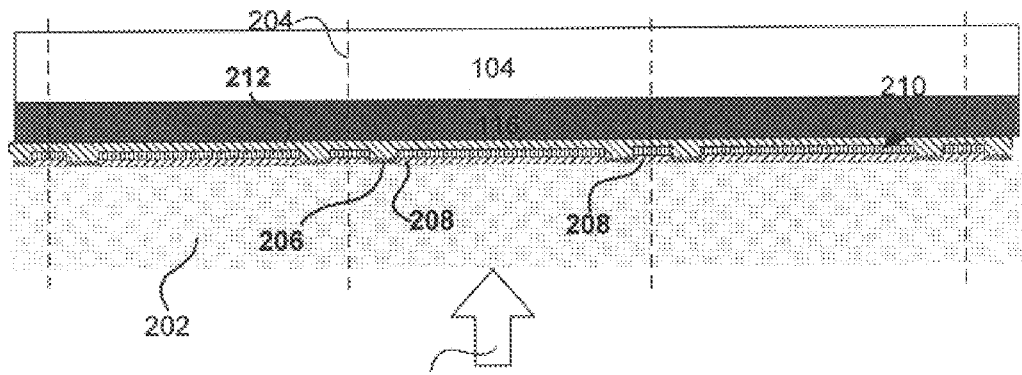
FIG. 2b illustrates a diagrammatic cross-sectional view of the formation of an upper protective structure for the known wafer level packaging process.
Figure 2C:
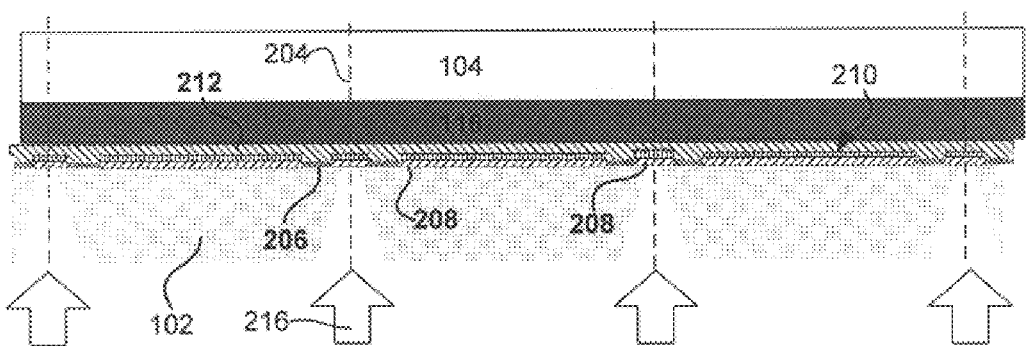
FIG. 2c illustrates a diagrammatic cross-sectional view of the trench formation process for the known wafer level packaging process.
Figure 2D:
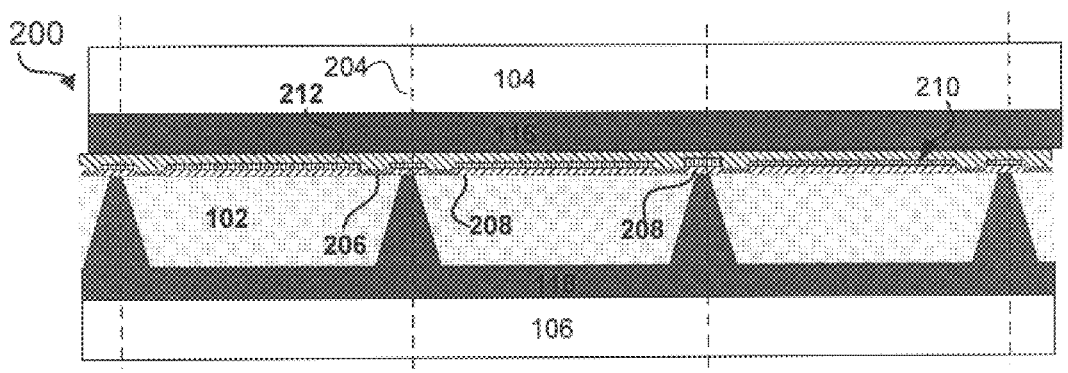
FIG. 2d illustrates a diagrammatic cross-sectional view of the formation of a lower protective structure for the known wafer level packaging process.
Figure 2E:
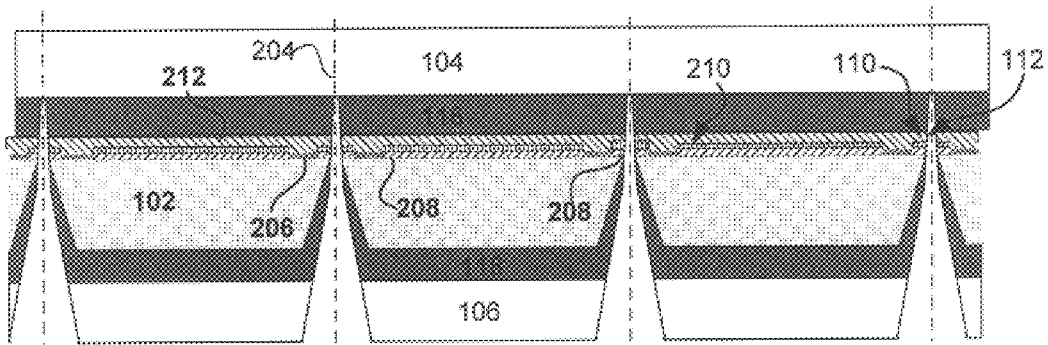
FIG. 2e illustrates a diagrammatic cross-sectional view of the notching process for the known wafer level packaging process.
Figure 2F:
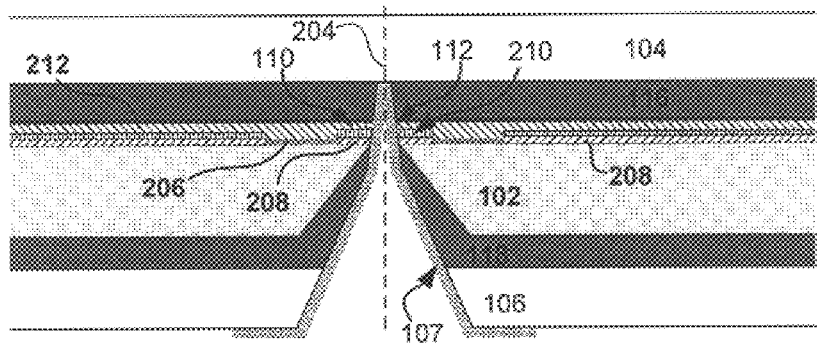
FIG. 2f illustrates a diagrammatic cross-sectional view of the lead-formation process for the known wafer level packaging process.
Figure 2G:
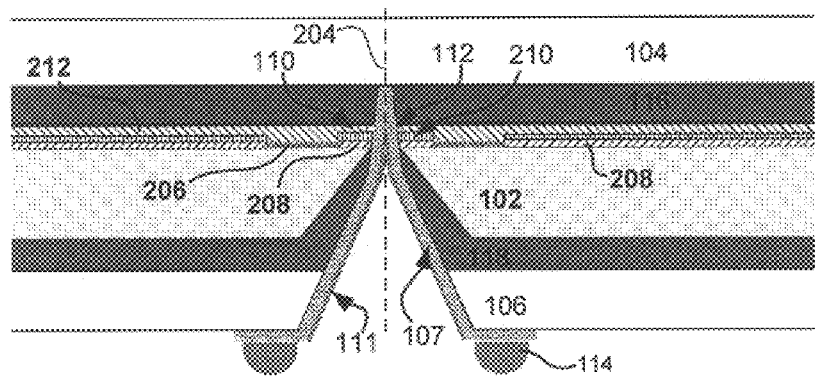
FIG. 2g illustrates a cross-sectional diagrammatic view of the pre-singulated wafer assembly for the known wafer level packaging process.
Figure 3A:
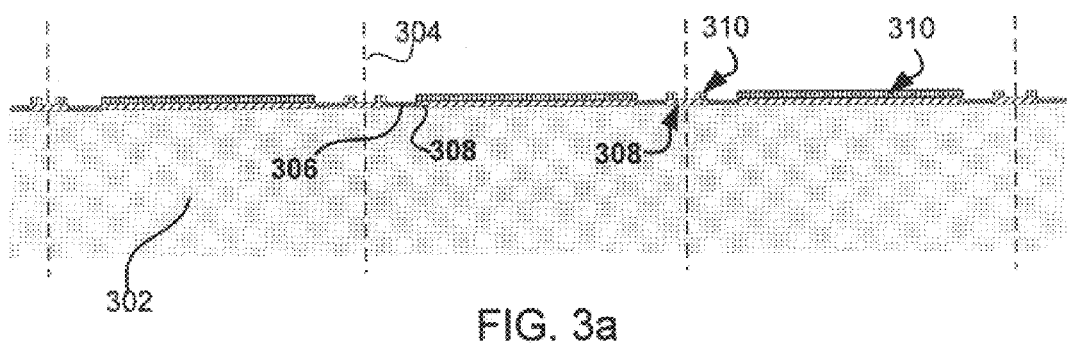
FIG. 3a illustrates a cross-sectional diagrammatic view of a first embodiment of the present invention showing three representative device areas.

The improved wafer level packaging process and embodiments of the present invention will herein be described in significant detail. FIG. 3a illustrates a cross-sectional view of a first embodiment of the present invention showing three representative device areas. The device areas on wafer 302 are each separated by saw streets 304. The saw-street is where the wafer will be cut into singulated IC packages. The wafer has a protective passivation layer 308, such as silicon nitride, that was deposited over the active surface area of the wafer during wafer processing. The fabrication and purpose of the passivation layer are both known in the art. A BCB layer 310 is lithographically patterned onto the passivation layer 308 in a known manner. The BCB layer generally has the necessary characteristics to reliable support subsequent metal trace deposition. In the present embodiment, BCB layer 310 is patterned outside of regions near saw-streets 304 such that it has no contact with the later formed T-junction, whereby the BCB layer 310 is not present near the T-junction. In a second embodiment of the present invention (not shown), BCB layer 310 is patterned outside of the region between contacts 306 that includes saw-street 304. In other embodiments, there may be no BCB layer 310 on the device area at all. As will be described in more detail below, excluding BCB layer 310 from regions near saw-street 304 substantially reduces stresses at the T-junction both as assembled and during thermal cycling. For clarity, only the first embodiment will herein be used to illustrate the present wafer level packaging process. It should be understood that unless otherwise noted, the herein-described process steps equally apply to the other embodiments as well.

Figure 3B:
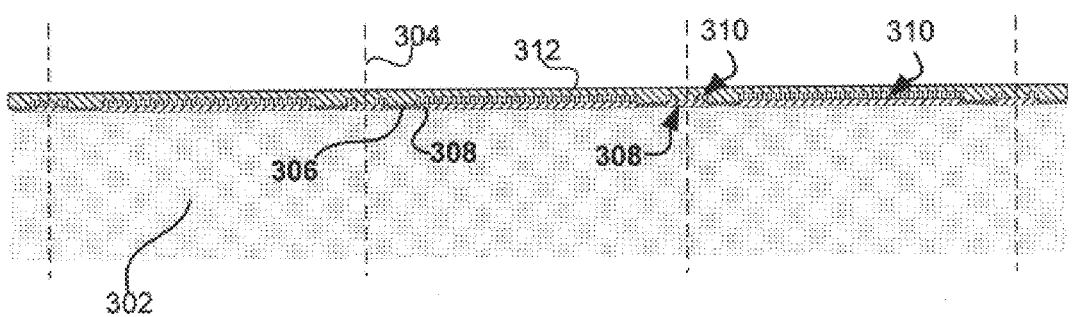
FIG. 3b illustrates a diagrammatic cross-sectional view of the interconnect layer patterning process according to the first embodiment of the present invention.
Figure 3C:
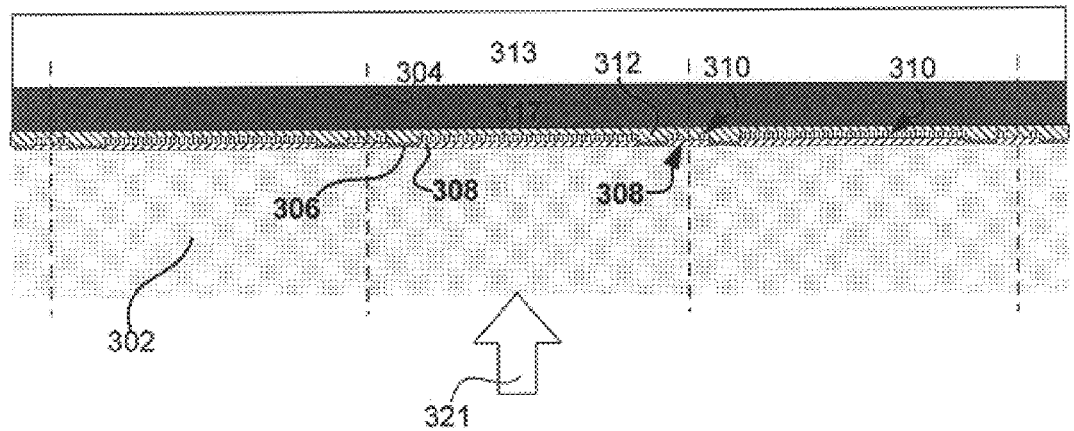
FIG. 3c illustrates a cross-sectional diagrammatic view of the formation of a protective upper substrate cover according to the first embodiment of the present invention.

As shown in FIG. 3b, a metal, such as aluminum, is patterned onto die terminals 306 and BCB layer 310 to form trace layer 312. The metal is further deposited to completely fill regions close to saw-streets 304 where there is no BCB layer 310. A protective upper substrate cover 313, such as glass, illustrated in FIG. 3c, is attached to the wafer's topside by an adhesive material 317 such as an optically clear epoxy. With the necessary support provided to wafer 302 by upper substrate cover 313, wafer 302 may be thinned to a predetermined thickness by known material removal process 321. For example, the wafer may be thinned by mechanically grinding such that the wafer thickness can fit into a predetermined package size. Currently, the wafer is ground down to 100 microns to fit into packages ranging between 0.6 and 2.0 mm in thickness.

Figure 3D:
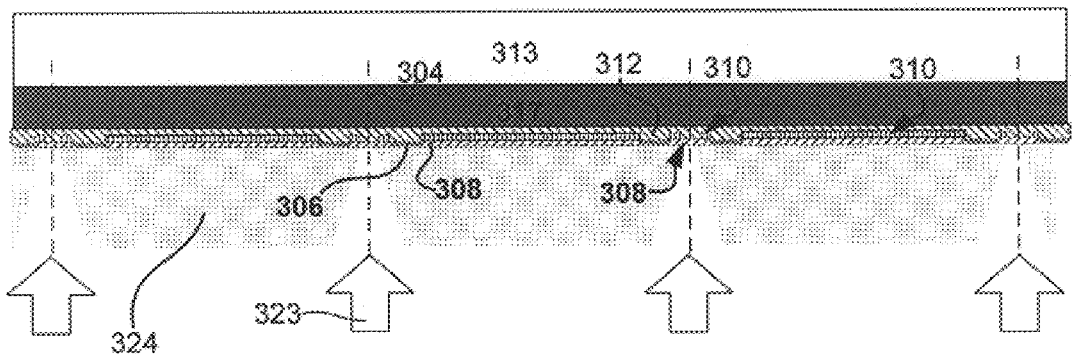
FIG. 3d is a cross-sectional diagrammatic illustration of the trench-forming process according to the first embodiment of the present invention.
Figure 3E:
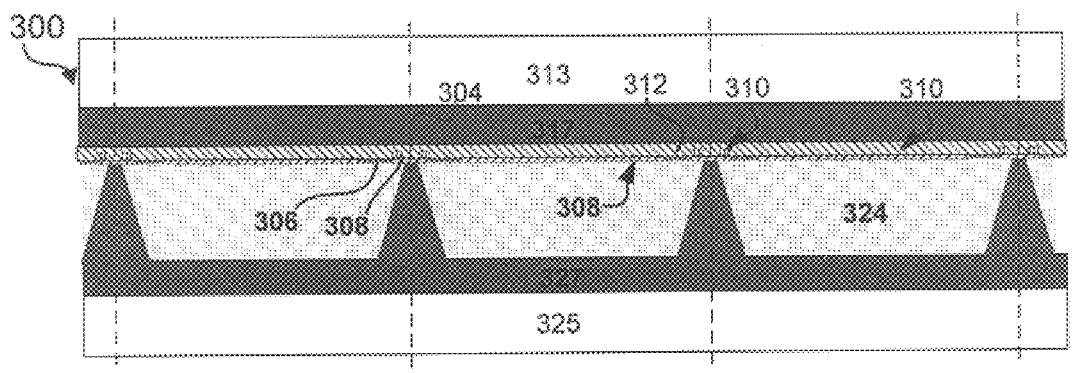
FIG. 3e illustrates a cross-sectional diagrammatic view of the formation of a lower protective substrate cover according to the first embodiment of the present invention.
Figure 3F:
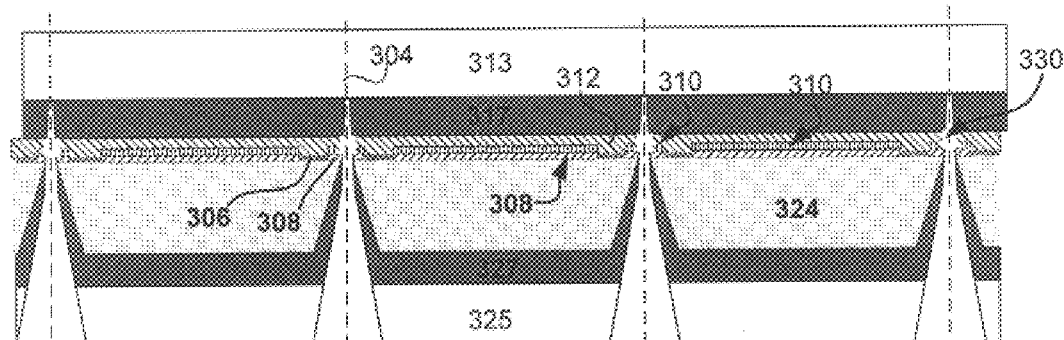
FIG. 3f illustrates a diagrammatic cross-sectional view of the notching process according to the first embodiment of the present invention.

As shown in FIG. 3d, known etching process 323 etches wafer 302 from the bottom of saw-streets 304 until passivation layer 308 is reached, thereby forming a multiplicity of trench-like structures on the wafer's backside that are aligned with saw-streets 304. The etching process also isolates semiconductor bulk device regions 324 from the wafer. The lower protective structure, shown in FIG. 3e, is formed by adhesively attaching lower substrate cover 325, made of glass for example, onto the wafer's bottom surface via an adhesive material 327, which can be an epoxy resin for example. Adhesive material 327 fills all the previously etched trenches. Wafer assembly 300 is notched, as shown in FIG. 3f, using conventional cutting techniques from the wafer's bottom side along saw-streets 304. Importantly, the notches cut through interconnect layer 312 and preferably extend up to, and including the bottom of upper substrate cover 313; thereby exposing cut trace surfaces. However, in other embodiments the notch may only cut through interconnect layer 312, but not cut into upper substrate cover 313. Generally, the notches enable access to the exposed traces at the saw-street for later lead formation.

Figure 3G:
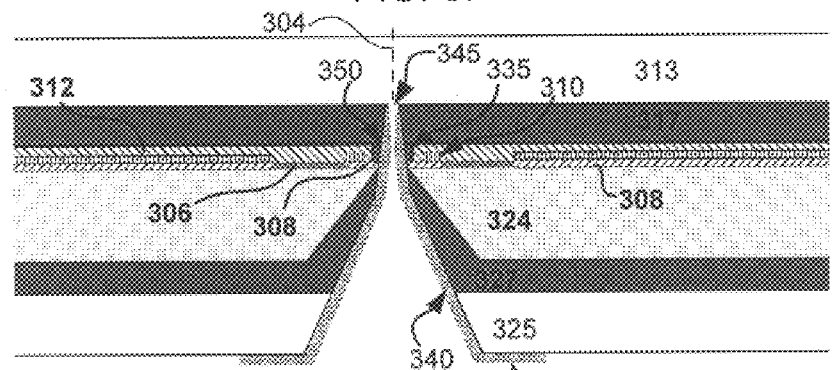
FIG. 3g illustrates a detailed diagrammatic cross-sectional view of a single saw-street region with leads formed according to the first embodiment of the present invention.

Because the exposed surfaces of the cut traces are prone to corrosion during the manufacturing process, they must undergo an anti corrosion treatment (ACT) procedure before the subsequent depositing external leads. The ACT procedure (not shown) can, for example, be a chemical etching of the exposed metal surfaces. The ACT procedure may over-etch beyond the surface corrosion on the exposed trace surfaces, thereby creating a gap 330 between the exposed trace surface and the previously notched outer package surface where leads will be deposited. FIG. 3g illustrates a detailed cross-sectional view of a single saw-street. As shown in the figure, a second metal 335 (gap fill) is deposited to fill gap 330 (FIG. 3f), the metal preferably having good adhesion to both the first metal used in interconnect layer 312 and a third metal used to form leads 340, while also being resistant to surface corrosion in ambient air and displaying good conforming characteristics. Suitable second metals include titanium, and its alloys such as titanium nitride (TiN), if the first metal is aluminum. By way of example, the second metal can be deposited by known methods such as sputtering into the notch and the exposed lower surface of glass cover 104. After gap fill metal 335 is deposited, leads 340 are formed by using known methods to deposit the third metal, such as aluminum, onto the exposed surfaces of gap-fill metal 335, passivation layer 310, and adhesive material 327, thereby making an electrical connection between leads 340 and die terminals 306. The deposition of leads 340 also extends below bottom substrate cover 325 to permit the formation of PCB mounting contacts thereon at PCB contact mounting areas 343. Usually, PCB contacts are formed below the package; however, contact mounting areas 343, and hence the PCB contacts, may be located on the exposed surfaces of leads 340 as required by the particular application.

The leads are further configured such that there is a lead separation 345 at saw-street 304 between the leads of adjacent device areas. Leads 340 and gap-fill metal 335 make physical, non-metallurgical, contact along T-junction 350. By way of example, lead separation 345 can be formed by any suitable method, including patterned etching, such that it permits the subsequent deposition of a protective dielectric onto the exposed surfaces of leads 340 near separation 345. For example, a photo-mask (not shown) is first appropriately deposited onto lead 340. This photo-mask removes the metal in the area where the photo-mask was deposited. Next, a solder-mask is applied over the metal, including the T-junction region, thus protecting the T-junction region from corrosion after the subsequent sawing along saw-streets 304.

In some embodiments (not shown), lead separation 345 extends to upper adhesive material 317, thereby exposing adhesive material 317 to subsequent application of a protective dielectric that continuously covers the junction of leads 340 and adhesive material 317. Optionally, any suitable lead-plating layer (not shown) can be formed on any exposed portion of leads 340.

Figure 3H:
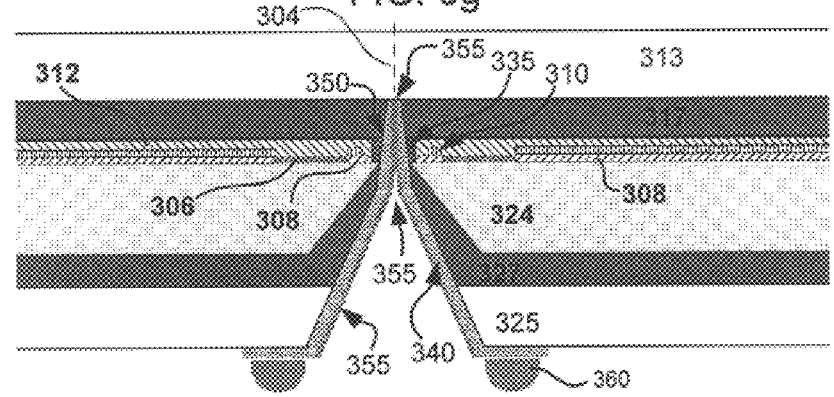
FIG. 3h illustrates a detailed diagrammatic cross-sectional view of the pre-singulation wafer level packaging assembly formed according to the first embodiment of the present invention.

FIG. 3h illustrates a detailed saw-street view of the completed wafer level packaging assembly, where a protective dielectric 355, such as a solder-mask, is deposited to cover the exposed surfaces of leads 340 excluding PCB contact mounting areas 343 (FIG. 3g). In some embodiments, dielectric 355 might not be applied to cover most of lead 340 as shown. However, in one aspect of the present invention dielectric 355 must cover at least the exposed surface of the notch in between the separated leads (i.e., the end section of lead 340, exposed upper substrate cover 313, and/or adhesive material 317). PCB contacts 360 are appropriately attached by known methods to PCB contact mounting areas 343 (FIG. 3g) on leads 340. It should be appreciated that although ball-type PCB contacts are shown in the Figure, any suitable contact type will work.

Figure 4:
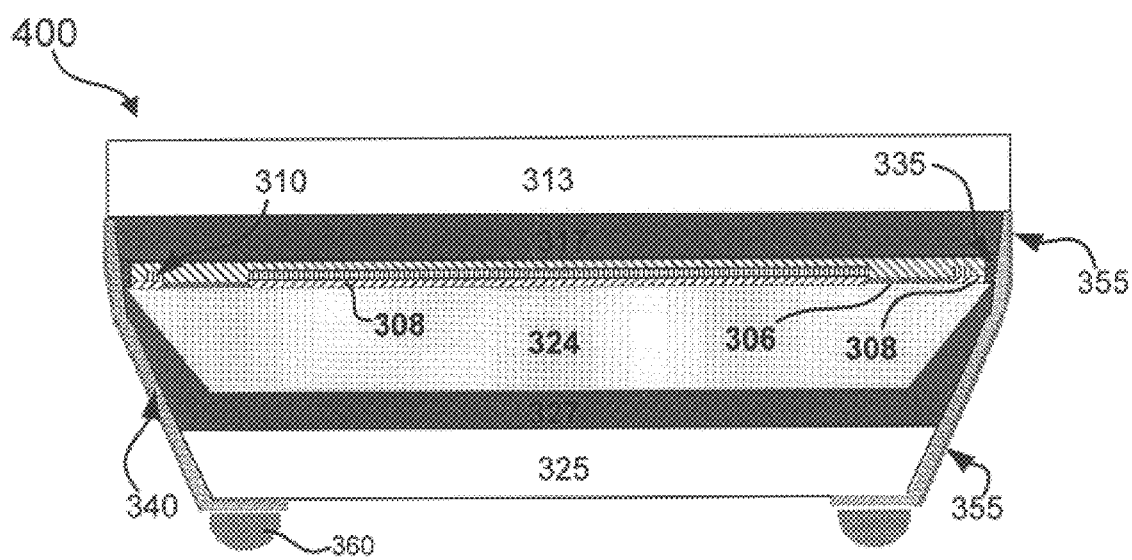
FIG. 4 illustrates a diagrammatic cross-sectional view of a completed IC package made according to the first embodiment of the present invention.

Cutting through saw-streets 304 singulates the individual IC packages, a cross-sectional view of which is illustrated in FIG. 4, by way of example. Completed IC package 400 can be surface mounted by known methods onto a PCB or other substrates.

Some benefits of the described process will now be discussed. The standard Shellcase style IC package manufacturing process results in some T-junction connection reliability and yield problems. One such potential T-junction connection reliability issue can occur during the operating life of the completed IC package where BCB thermal expansion forces put a stress onto the T-junction. As the BCB conventionally makes direct physical contact with the leads, BCB thermal expansion can force the T-junction to separate. However, by having no BCB material patterned near the saw-street, as prescribed by aspects of the present invention, BCB thermal expansion forces are substantially deflected away from the T-junction, thus improving device reliability.

In conventional methods, another T-junction connection issue can occur during the ACT procedure, where the trace ends that are sometimes over-etched are recessed and fail to make good contact with the subsequently deposited leads. In contrast, the present invention can achieve a substantial yield improvement by filling the gap created by over-etching, with a suitable metal, as described by aspects of the described embodiments.

Conventional Shellcase style IC package manufacturing processes are further vulnerable to another mode of T-junction connection separation where the T-junction may separate because the lead-ends that are cut during the notching procedure are left unprotected, thereby reducing device operating reliability by permitting humidity to delaminate the lead from the upper adhesive material. However, some embodiments of the present invention substantially prevent humidity from separating the T-junction by covering the lead-end and the otherwise exposed interface between the lead-end and the notched surface with a protective dielectric.

Although only a few embodiments of the present invention have been described in detail, it should be understood that the present invention may be embodied in many other specific forms without departing from the spirit or scope of the invention. Particularly, in the illustrated embodiments only traces bridging die terminals on either side of the saw-street were shown. However, the foregoing descriptions also apply to configurations where it may not be possible to route all traces directly from the die terminal to the saw-street, and the traces may have to be indirectly routed to enter the saw-street where there is no preceding die terminal nearby. Similarly, for clarity, only an outer row of PCB contacts have been illustrated, however, a full grid array of PCB contacts is possible, whereby a multiplicity of leads are routed, by known methods, over the bottom of the lower substrate cover to a multiplicity of PCB contacts. Furthermore, those in the art will appreciate that although the foregoing embodiments described a BCB layer, other contemplated embodiments can instead use another material with similar properties as BCB and remain within the scope of the present invention. Those in the art will further appreciate that although the foregoing improvements were illustrated in one embodiment, other embodiments of the present invention can use any combination of these improvements. Therefore, the present examples are to be considered as illustrative and not restrictive, and the invention is not to be limited to the details given herein, but may be modified within the scope of the appended claims.

We claim:

1. A wafer level method of packaging integrated circuits comprising:
   providing a wafer having a multiplicity of integrated circuit dice formed therein, each die having a plurality of die contact pads thereon;
   forming and patterning a conductive trace layer generally over a top surface of the wafer to define a plurality of traces that are electrically coupled to associated die contact pads;
   adhering a top substrate directly or indirectly to a top surface of the wafer over the trace layer;
   froming trenches between the dice from a back side of the wafer, wherein the trenches are formed along dice lines;
   adhering a bottom substrate directly or indirectly to a bottom surface of the wafer thereby forming a sandwiched wafer structure;
   notching a back surface of the sandwiched wafer structure along the dice lines, wherein the notching cuts through and exposes portions of the traces;
   treating the exposed surfaces of the cut traces with an anti-corrosion agent after notching the back surface of the sandwiched wafer along the dice lines; and
   forming and patterning first and second conductor layers on the notched surface of the sandwiched wafer structure after treating the exposed surfaces of the cut traces with the anti-corrosion agent, wherein the first conductor layer fills any gaps between the traces and the previously notched outer package surface caused by the anti-corrosion treatment thereby forming a plurality of conductors that contact, but are not metallurgically bonded with, associated traces.

2. A method as recited in claim 1 wherein the traces and the second conductive layer are formed from aluminum and the first conductive layer is formed from a material selected from the group consisting of titanium and titanium based alloys.

3. A method as recited in claim 2 further comprising:
   coating the conductors with a material that does not readily significantly oxidize when exposed to ambient air, so that the aluminum in the conductors is not exposed; and
   dicing the sandwiched wafer structure after the conductors have been coated by cutting through the notches, wherein the patterning of the conductor layer is arranged such that the conductors are not exposed by the dicing operation.

4. A method as recited in claim 3 wherein the conductors are coated with a protective dielectric.

5. A method as recited in claim 4 wherein the dielectric coating also includes coating the exposed junction between the conductor and the adjacent material.

6. A method as recited in claim 1 wherein benzocyclobutene is not used under the trace layer in regions that will have notches formed therein so that the benzocyclobutene is not present in the proximity of a T-junction.

7. A method as recited in claim 6 wherein no benzocyclobutene layer whatsoever is applied during packaging.

8. A method as recited in claim 6 wherein prior to the formation of the trace layer, a benzocyclobutene layer is formed over a top surface of the wafer and the benzocyclobutene layer is patterned to avoid dice line areas that will later be trenched or notched.

9. A wafer level method of packaging integrated circuits comprising:

providing a wafer having a multiplicity of integrated circuit dice formed therein, each die having a plurality of die contact pads thereon;

forming and patterning a conductive trace layer generally over a top surface of the wafer to define a plurality of traces that are electrically coupled to associated die contact pads;

adhering a top substrate directly or indirectly to a top surface of the wafer over the trace layer;

forming trenches between the dice from a back side of the wafer, wherein the trenches are formed along dice lines;

adhering a bottom substrate directly or indirectly to a bottom surface of the wafer thereby forming a sandwiched wafer structure;

notching a back surface of the sandwiched wafer structure along the dice lines, wherein the notching cuts through and exposes portions of the traces;

forming and patterning a conductor layer on the notched surface of the sandwiched wafer structure thereby forming a plurality of conductors that contact, but are not metallurgically bonded with, associated traces;

coating the conductors so that the material used to form the conductors is not exposed; and dicing the sandwiched wafer structure after the conductors have been covered by cutting through the notches, wherein the patterning of the conductor layer is arranged such that the conductors are not exposed by the dicing operation.

10. A method as recited in claim 9 wherein the conductor layer is formed at least partially from aluminum or copper and the coating is done using a material that does not readily significantly oxidize when exposed to ambient air thereby protecting the aluminum conductors from oxidation.

11. A method as recited in claim 9 wherein benzocyclobutene is not used under the trace layer in regions that will have notches formed therein so that the resulting package does not have any exposed benzocyclobutene/trace junctions.

12. A method as recited in claim 11 wherein no benzocyclobutene layer applied whatsoever during packaging.

13. A method as recited in claim 11 wherein prior to the formation of the trace layer, a benzocyclobutene layer is formed over a top surface of the wafer and the benzocyclobutene layer is patterned to avoid dice line areas that will later be trenched or notched.

14. A wafer level method of packaging integrated circuits comprising:

providing a wafer having a multiplicity of integrated circuit dice formed therein, each die having a plurality of die contact pads thereon;

forming a passivation layer over a top surface of the wafer;

forming and patterning a benzocyclobutene layer generally over the passivation layer;

forming and patterning the conductive trace layer over the benzocyclobutene layer to define a plurality of conductive traces that are electrically coupled to associated die contact pads;

adhering a top substrate directly or indirectly to a top surface of the wafer over the trace layer;

forming trenches between the dice from a back side of the wafer, wherein the trenches are formed along dice lines;

adhering a bottom substrate directly or indirectly to a bottom surface of the wafer thereby forming a sandwiched wafer structure;

notching a back surface of the sandwiched wafer structure along the dice lines, wherein the notching cuts through and exposes portions of the traces;

forming and patterning a conductor layer on the notched surface of the sandwiched wafer structure thereby forming a plurality of conductors that contact, but are not metallurgically bonded with, associated traces; and dicing the sandwiched wafer structure after the conductors have been covered by cutting through the notches; and wherein the benzocyclobutene layer is patterned such that benzocyclobutene material is not used under the trace layer in regions that will have notches formed therein so that the resulting package does not have any exposed BCB/trace junctions.

15. A method as recited in claim 14 wherein no benzocyclobutene layer applied whatsoever during packaging.

16. A method as recited in claim 14 wherein prior to the formation of the trace layer, a benzocyclobutene layer is formed over a top surface of the wafer and the benzocyclobutene layer is patterned to avoid dice line areas that will later be trenched or notched.

17. A method as recited in claim 14 wherein there is no intermediate material between the trace layer and the wafer in regions that will have notches formed therein so that the resulting package does not have any exposed intermediate-material/trace junctions.

* * * * *

UNITED STATES PATENT AND TRADEMARK OFFICE
CERTIFICATE OF CORRECTION

PATENT NO.   : 6,607,941 B2
DATED        : August 19, 2003
INVENTOR(S)  : Prabhu et al.

It is certified that error appears in the above-identified patent and that said Letters Patent is hereby corrected as shown below:

Column 8,
Line 26, change "froming" to -- forming --.

Signed and Sealed this

Fifteenth Day of June, 2004

JON W. DUDAS
*Acting Director of the United States Patent and Trademark Office*